United States Patent
Nakajima et al.

(10) Patent No.: US 7,935,188 B2
(45) Date of Patent: May 3, 2011

(54) VERTICAL THERMAL PROCESSING APPARATUS AND METHOD OF USING THE SAME

(75) Inventors: Wataru Nakajima, Tokyo-To (JP); Takuya Oikawa, Tokyo-To (JP); Hisashi Inoue, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 581 days.

(21) Appl. No.: 11/660,898

(22) PCT Filed: Aug. 24, 2005

(86) PCT No.: PCT/JP2005/015367
§ 371 (c)(1),
(2), (4) Date: Feb. 23, 2007

(87) PCT Pub. No.: WO2006/022303
PCT Pub. Date: Mar. 2, 2006

(65) Prior Publication Data
US 2008/0187652 A1    Aug. 7, 2008

(30) Foreign Application Priority Data
Aug. 26, 2004    (JP) .................. 2004-246578

(51) Int. Cl.
*C23C 16/00*    (2006.01)
*C23C 16/54*    (2006.01)

(52) U.S. Cl. ....... 118/724; 118/715; 118/722; 427/96.8; 156/345.37

(58) Field of Classification Search .................. 427/96.8; 118/715, 722, 724
See application file for complete search history.

(56) References Cited

U.S. PATENT DOCUMENTS

| | | | |
|---|---|---|---|
| 4,753,192 A * | 6/1988 | Goldsmith et al. ........... | 118/725 |
| 4,943,234 A * | 7/1990 | Sohlbrand ..................... | 432/152 |
| 2003/0164225 A1* | 9/2003 | Sawayama et al. ...... | 156/345.29 |
| 2003/0173347 A1* | 9/2003 | Guiver .......................... | 219/390 |

FOREIGN PATENT DOCUMENTS

| JP | 6-45335 | 6/1994 |
|---|---|---|
| JP | 8-330318 | 12/1996 |
| JP | 9-097787 | 4/1997 |
| JP | 2001-280848 | 10/2001 |
| JP | 2003-209063 | * 7/2003 |

OTHER PUBLICATIONS

Supplementary European Search Report issued on Feb. 11, 2009 for application No. EP 05 77 5200.

(Continued)

*Primary Examiner* — Shamim Ahmed
(74) *Attorney, Agent, or Firm* — Smith, Gambrell & Russell, LLP

(57) ABSTRACT

The invention is a vertical thermal processing apparatus including: a processing container that contains an object to be processed; a main heater provided so as to surround the processing container, the main heater being capable of heating the processing container and having a rapid cooling function; a gas-discharging part formed at an upper portion of the processing container, the gas-discharging part being bent; an auxiliary heater provided so as to heat the gas-discharging part; a moving mechanism for evacuating the auxiliary heater away from the gas-discharging part during a rapid cooling process of the main heater; and a forcibly gas-discharging mechanism for forcibly discharging an atmospheric gas in a vicinity of the gas-discharging part.

3 Claims, 7 Drawing Sheets

OTHER PUBLICATIONS

Notification of Transmittal of Translation of the International Preliminary Report on Patentability (Form PCT/IB/338) in connection with PCt/JP2005/015367, dated Jan. 2004.

International Preliminary Report on Patentability (Form PCT/IB/373) in connection with PCT/JP2005/015367, dated Jan. 2004.

Translation of Written Opinion (Form PCT/ISA/237) in connection with PCt/JP2005/015367, dated Jan. 2004.

* cited by examiner

VERTICAL THERMAL PROCESSING APPARATUS AND METHOD OF USING THE SAME

FIELD OF THE INVENTION

This invention relates to a vertical thermal processing apparatus and a method of using the same.

BACKGROUND ART

In manufacturing semiconductor devices, various types of thermal processing apparatuses are used for conducting various kinds of processes, such as an oxidation process, a diffusion process and a CVD (Chemical Vapor Deposition) process, to an object to be processed, such as a semiconductor wafer. As one of such thermal processing apparatuses, a vertical (type of) processing apparatus is used, which is capable of conducting a thermal process to a large number of objects to be processed at one time.

A vertical thermal processing apparatus comprises, generally, a processing container made of quartz that contains a objects to be processed, a main heater provided so as to surround the processing container, the main heater being capable of heating the processing container and having a rapid cooling function, a gas-discharging part formed at an upper portion of the processing container, the gas-discharging part being bent to connect to a discharging pipe, and an auxiliary heater provided so as to heat the gas-discharging part (for example, refer to Japanese Patent Laid-Open Publication No. 2003-209063). An opening part is formed at a lower portion of the processing container, and a lid is provided so as to be capable of moving up and down (be capable of opening and closing) so as to close the opening part. A boat made of quartz that holds objects to be processed in a tier-like (multistage) manner is provided at an upper portion of the lid.

According to the above-described vertical thermal processing apparatus, it can be rapidly heated up and rapidly cooled down, because a thermal capacity of the processing container is smaller in comparison with a thermal processing apparatus that has a processing container having a double tube structure with a large thermal capacity. Therefore, a certain improvement in throughput thereof can be expected. Additionally, because the gas-discharging part is heated by the auxiliary heater, it is possible to restrain a processing gas component from adhering to an inner surface of the gas-discharging part and forming a film thereon.

Incidentally, in the above-described vertical thermal processing apparatus, after a thermal processing (process) is finished and the objects to be processed are taken out of the boat, only the boat is conveyed into the processing container and the lid is closed. Next, in this state, the processing container is cooled down to a predetermined temperature, for example, a normal temperature by making use of a rapid cooling function of the main heater, and a cleaning gas (such as an etching gas) is introduced into an inside of the processing container, so that an inner surface of the processing container and the boat are dry-cleaned (dry-scrubbed).

However, in the above-described vertical thermal processing apparatus, the auxiliary heater does not have the rapid cooling function. Therefore, it is difficult to cool down the gas-discharging part as rapidly as the processing container (the main body). Consequently, a film may remain on an inner surface of the gas-discharging part, and this may cause particles. In addition, there is a problem; because it needs a long time for the gas-discharging part to be cooled down to the same temperature as that of the processing container (the main body), a waiting time during operation of the apparatus or a downtime during maintenance thereof are made longer, and therefore this will be an obstacle to the improvement in throughput and the improvement in productivity.

SUMMARY OF THE INVENTION

This invention is intended to solve the above problems. The object of this invention is to provide a vertical thermal processing apparatus that can cool down a gas-discharging part thereof as rapidly as a processing container thereof so as to improve throughput thereof, and to provide a method of using the vertical thermal processing apparatus.

The present invention is a vertical thermal processing apparatus comprising: a processing container that contains an object to be processed, a main heater provided so as to surround the processing container, the main heater being capable of heating the processing container and having a rapid cooling function; a gas-discharging part formed at an upper portion of the processing container, the gas-discharging part being bent; an auxiliary heater provided so as to heat the gas-discharging part; a moving mechanism for evacuating the auxiliary heater away from the gas-discharging part during a rapid cooling process of the main heater; and a forcibly gas-discharging mechanism for forcibly discharging an atmospheric gas in a vicinity of the gas-discharging part.

According to the present invention, it is possible to cool down the gas-discharging part as rapidly as the processing container by evacuating the auxiliary heater and by forcibly discharging the atmospheric gas in the vicinity of the gas-discharging part by means of the forcibly gas-discharging mechanism. Accordingly, throughput thereof can be improved.

Preferably, the forcibly gas-discharging mechanism has: a heat-shielding cover that covers the gas-discharging part and that is capable of communicating with an inside of the auxiliary heater when the auxiliary heater is evacuated, and a gas-discharging pipe connected to the heat-shielding cover for forcibly discharging a gas in the heat-shielding cover. In this case, the gas-discharging part can be effectively cooled down. Additionally, an adverse influence caused by a heat radiation out of the gas-discharging part can be prevented.

Furthermore, preferably, the heat-shielding cover has a water cooling structure. In this case, the gas-discharging part can be cooled down more effectively.

In addition, preferably, a gas-discharging duct for forcibly discharging a gas in the main heater is connected to the main heater, and the gas-discharging pipe of the forcibly gas-discharging mechanism is connected to the gas-discharging duct. In this case, a forcibly gas-discharging power by the gas-discharging duct of the main heater can be applied as a forcibly gas-discharging power by the forcibly gas-discharging mechanism of the auxiliary heater, so that it is possible to simplify the structure and to reduce cost.

Additionally, the present invention is a method of using a vertical thermal processing apparatus including: a processing container that contains an object to be processed; a main heater provide so as to surround the processing container, the main heater being capable of heating the processing container and having a rapid cooling function; a gas-discharging part formed at an upper portion of the processing container, the gas-discharging part being bent; an auxiliary heater provided so as to heat the gas-discharging part; a moving mechanism for evacuating the auxiliary heater away from the gas-discharging part during a rapid cooling process of the main heater; and a forcibly gas-discharging mechanism for forcibly discharging an atmospheric gas in a vicinity of the gas-discharging part; the method comprising a step of rapidly cooling down an inside of the main heater, evacuating the auxiliary heater, and rapidly cooling down the processing container and the gas-discharging part by forcibly discharging an atmospheric gas in a vicinity of the gas-discharging part.

According to the present invention, by rapidly cooling down the processing container and the gas-discharging part, an inner surface of the processing container and an inner surface of the gas-discharging part can be dry-cleaned rapidly and evenly. Accordingly, it is possible to prevent generation of particles caused by a remaining film and to improve throughput thereof.

Furthermore, the present invention is a storage medium capable of being read by a computer, the storage medium storing a program that controls a method of using a vertical thermal processing apparatus, the vertical thermal processing apparatus including: a processing container that contains an object to be processed; a main heater provide so as to surround the processing container, the main heater being capable of heating the processing container and having a rapid cooling function; a gas-discharging part formed at an upper portion of the processing container, the gas-discharging part being bent; an auxiliary heater provided so as to heat the gas-discharging part; a moving mechanism for evacuating the auxiliary heater away from the gas-discharging part during a rapid cooling process of the main heater; and a forcibly gas-discharging mechanism for forcibly discharging an atmospheric gas in a vicinity of the gas-discharging part; and the method comprising a step of rapidly cooling down an inside of the main heater, evacuating the auxiliary heater, and rapidly cooling down the processing container and the gas-discharging part by forcibly discharging an atmospheric gas in a vicinity of the gas-discharging part.

DESCRIPTION OF THE PREFERRED EMBODIMENT

Hereinafter, an embodiment of the present invention is described in details based on the attached drawings.

Figure 1:
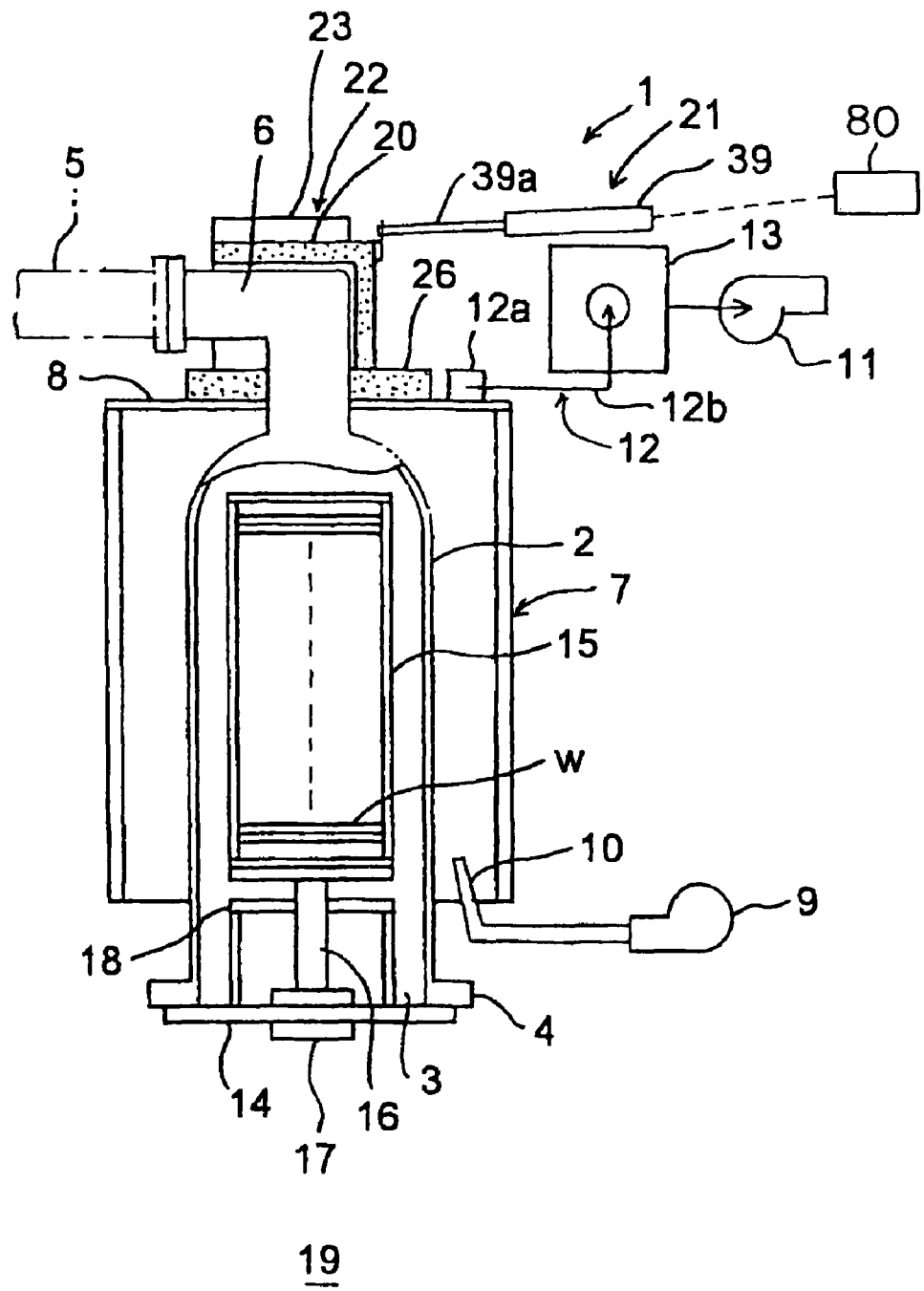
FIG. 1 is a schematic vertical sectional view of a vertical thermal processing apparatus according to an embodiment of the present invention.
Figure 2:
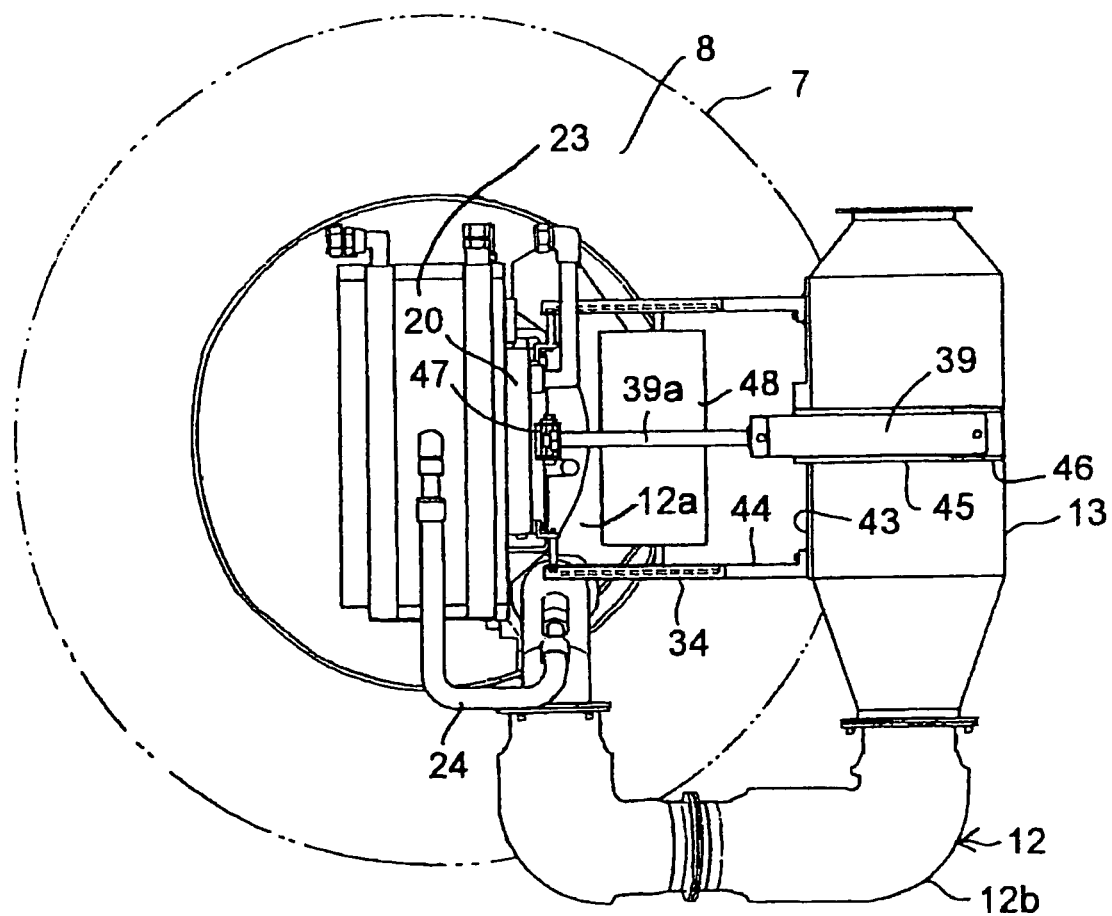
FIG. 2 is a plan view showing an upper portion of the vertical thermal processing apparatus of FIG. 1.
Figure 3:
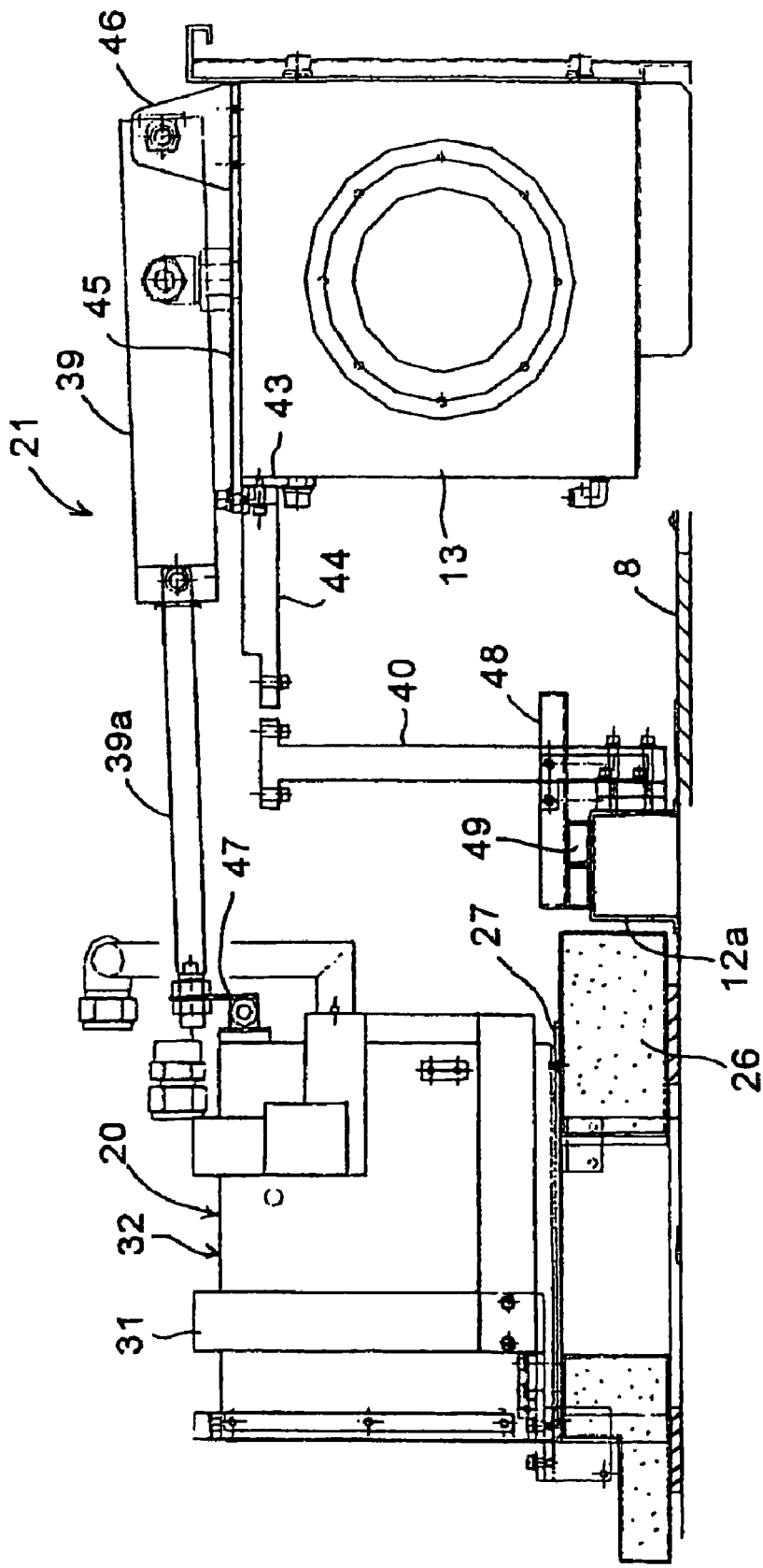
FIG. 3 is a schematic side view showing a moving mechanism of an auxiliary heater.
Figure 4A:
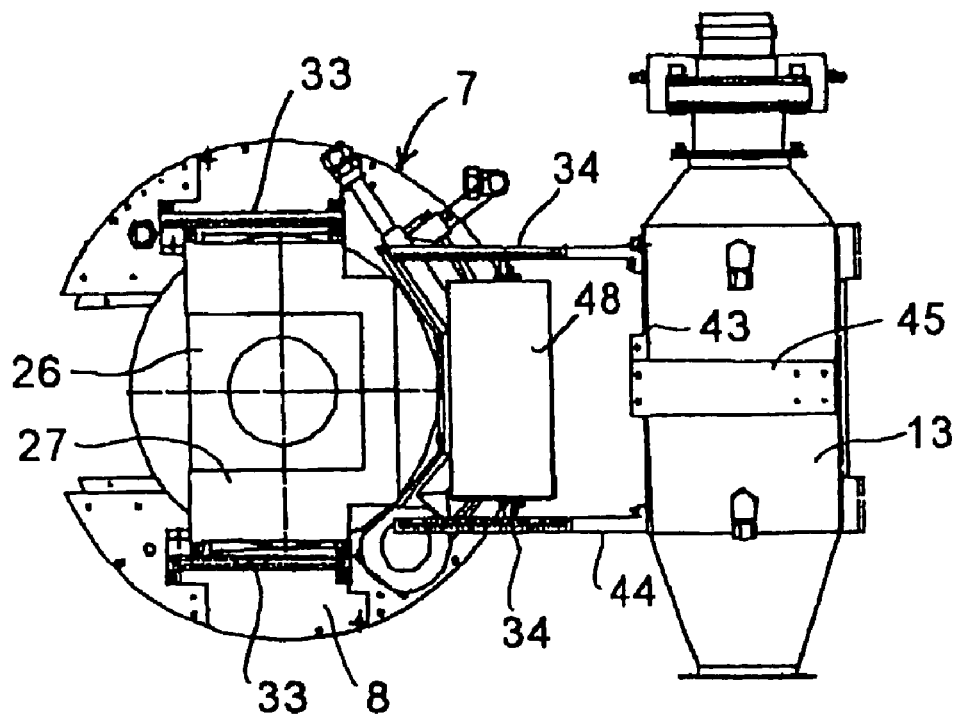
FIG. 4A is a plan view showing an arrangement of rails of the moving mechanism of FIG. 3.
Figure 4B:
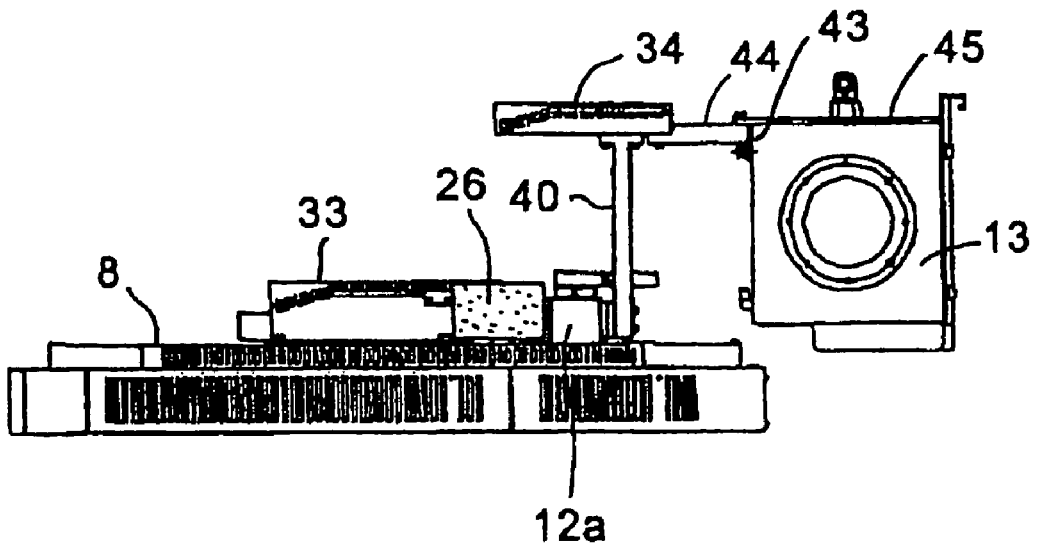
FIG. 4B is a side view showing the arrangement of the rails of the moving mechanism.
Figure 5A:
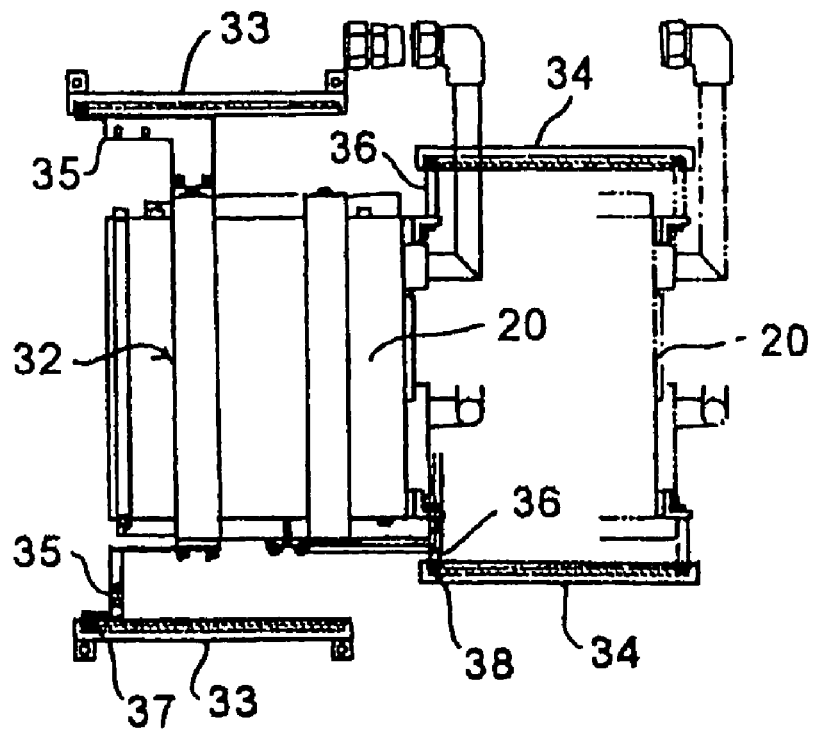
FIG. 5A is a plan view for explaining a movement of the auxiliary heater.
Figure 5B:
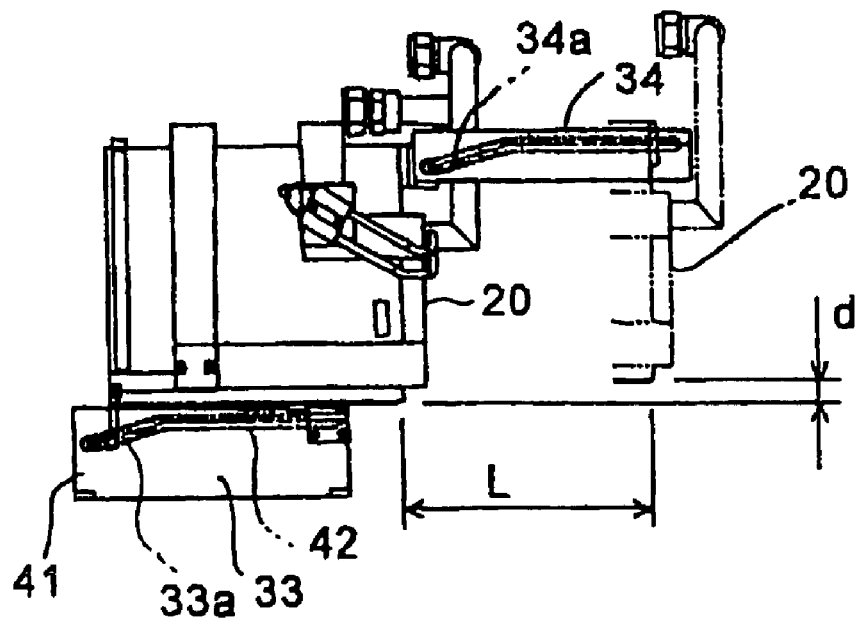
FIG. 5B is a side view for explaining the movement of the auxiliary heater.
Figure 6:
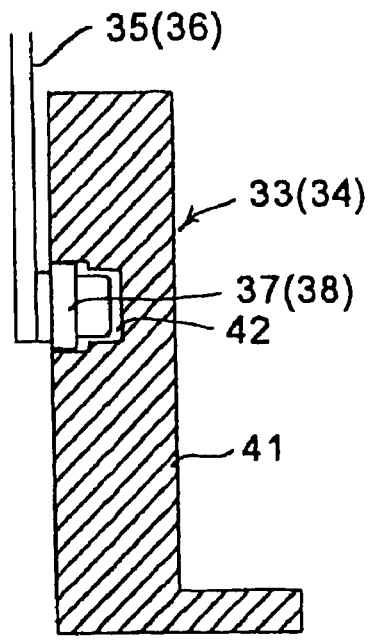
FIG. 6 is a sectional view of a rail.
Figure 7:
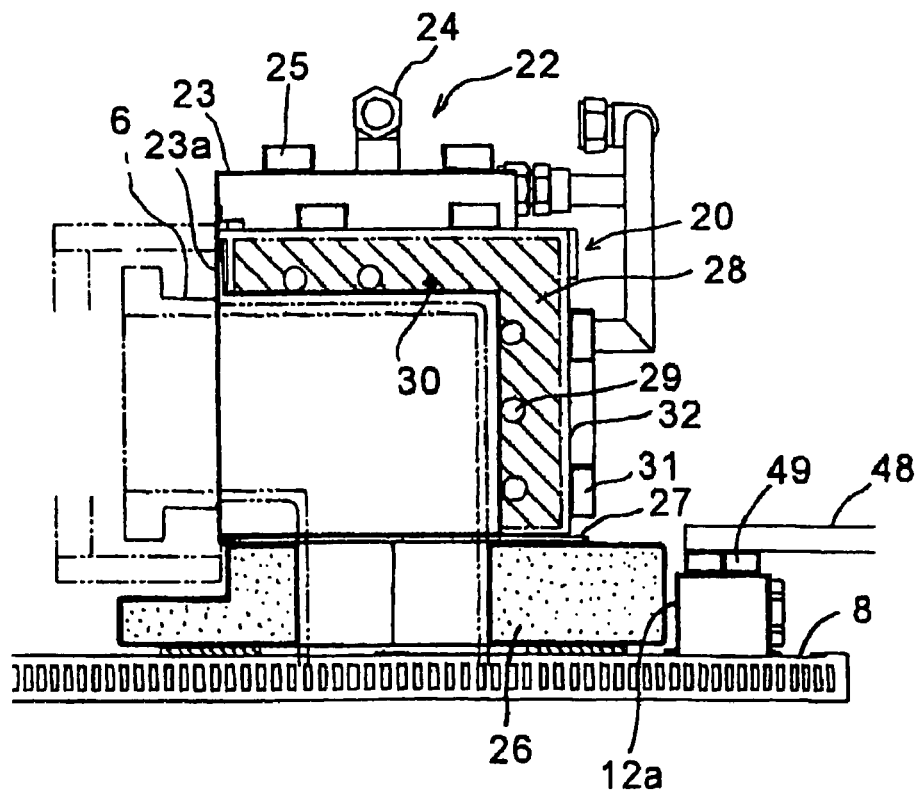
FIG. 7 is a sectional view of the auxiliary heater, under a heated state thereof.
Figure 8:
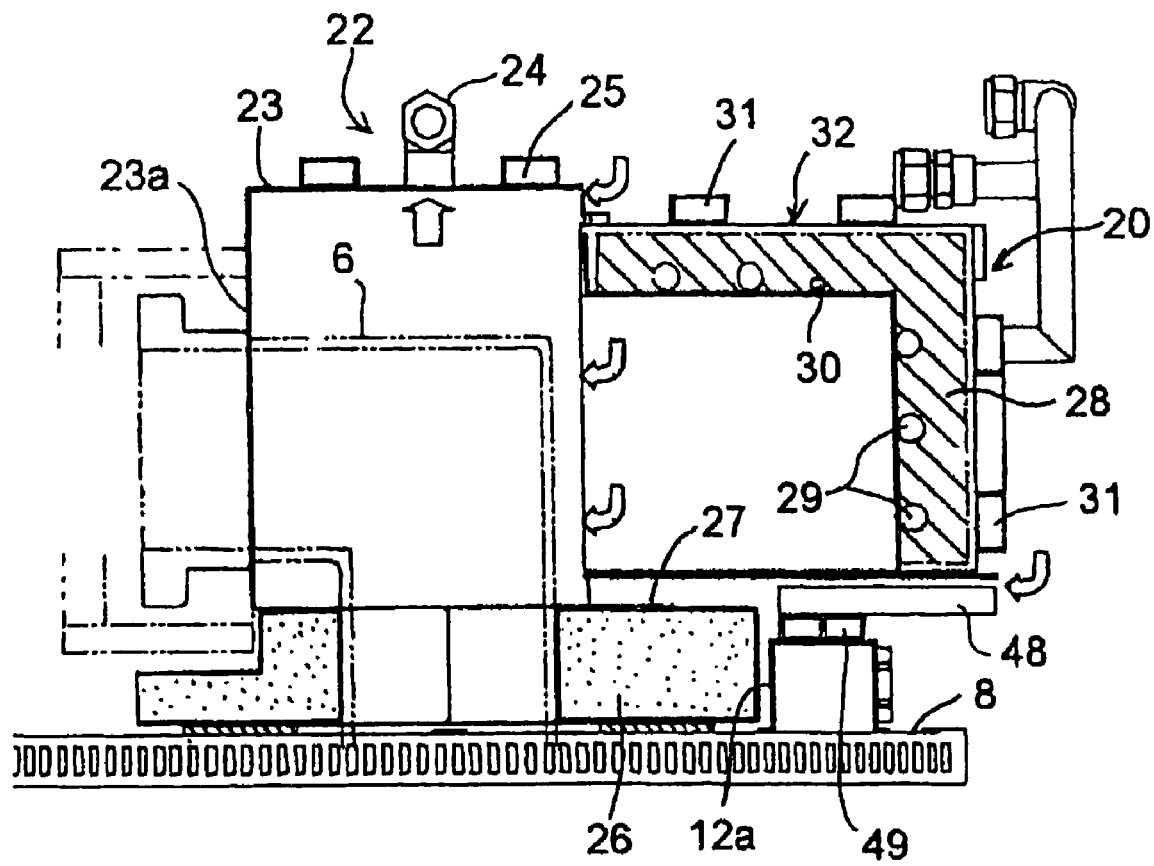
FIG. 8 is a sectional view of the auxiliary heater, under a forcibly cooled state thereof.

FIG. 1 is a schematic vertical sectional view of the vertical thermal processing apparatus according to an embodiment of the present invention. FIG. 2 is a plan view showing an upper portion of the vertical thermal processing apparatus of FIG. 1. FIG. 3 is a schematic side view showing a moving mechanism of an auxiliary heater. FIG. 4A is a plan view showing an arrangement of rails of the moving mechanism of FIG. 3, and FIG. 4B is a side view showing the arrangement of the rails of the moving mechanism of FIG. 3. FIG. 5A is a plan view for explaining a movement of the auxiliary heater, and FIG. 5B is a side view for explaining the movement of the auxiliary heater. FIG. 6 is a sectional view of a rail. FIG. 7 is a sectional view of the auxiliary heater, under a heated state thereof. FIG. 8 is a sectional view of the auxiliary heater, under a forcibly cooled state thereof.

The vertical thermal processing apparatus 1 of FIG. 1 includes: a not-shown housing, and a vertical processing container (also to be referred to as a reaction pipe) 2 that is provided in the housing and that contains objects to be processed, for example semiconductor wafers w, in order to conduct a predetermined thermal process thereto. The processing container 2 is made of a quartz (quartz glass) having a heat resistance and a corrosion resistance. An upper portion of the processing container 2 is formed in a dome-like manner, to be concrete, in an upside-down funnel-like manner, and a lower portion of the processing container 2 opens as a furnace opening 3. A flange 4 is provided at an opening end of the lower portion of the processing container 2. The flange 4 is fixed on a base plate via a flange holder (not shown in the drawings).

A gas-introducing open part for connecting a gas-introducing pipe that introduces a processing gas and an inert gas (for example, $N_2$) is provided at the lower part of the processing container 2 (not shown in the drawings). A gas-discharging part 6 for connecting a gas-discharging pipe 5 is formed, being bent in an L-shape manner, at a center of a top portion of the processing container 2. A pressure control system capable of decompressing an inside of the processing container 2 to a predetermined pressure, for example about 110 kgf, is connected to the gas-discharging pip 5. The pressure control system has a vacuum pump, a pressure sensor, a pressure control valve and a controller.

A cylindrical main heater 7 capable of heating and controlling the inside of the processing container 2 at a predetermined temperature, for example 300° C. to 1000° C., and having a rapid cooling function, is provided at a circumference of the processing container 2. In this embodiment, a main body 7a of the main heater 7 is composed of a water-cooling jacket made of a metal (for example, made of SUS), and a carbon wire that is capable of being rapidly heated and cooled is adopted as a heater element (not shown in the drawings). The main heater 7 is placed on the base plate. An upper portion of the main heater 7 is covered with a top panel 8. The gas-discharging part 6 is protruded by penetrating the top panel 8.

The main heater 7 and the processing container 2 in the main heater 7 are forcibly air-cooled during a temperature-lowering process or during a maintenance such as a dry cleaning. To achieve this, a ventilating nozzle 10 connected to a ventilator 9 for sending an air of a room temperature into the main heater 7 is provided at a lower portion of the main heater 7, and a gas-discharging duct 12 connected to a gas-discharging fan 11 is provided at an upper portion of the main heater 7. The gas-discharging duct 12 is mainly composed of: a first duct 12a that is arranged on the top panel 8, and a second duct 12b that connects the first duct 12a and a factory gas-discharging system. A heat exchanging unit 13 for lowering a gas-discharging temperature is provided at the second duct 12b.

At the lower portion of the processing container 2, a lid 14 that seals the opening (furnace opening) 3 of the lower portion of the processing container 2 is provided so as to be capable of moving up and down (capable of opening and closing) by means of a not-shown moving up-and-down mechanism. A boat (a holder) 15 made of quartz that holds a plurality of, for example, about 25 to 50 wafers w in a vertical direction at predetermined intervals in a tier-like manner is provided at an upper portion of the lid 14. The boat 15 has a prop 16 at a central portion of an under part thereof. The prop 16 is connected to a rotation-introducing mechanism 17 that is provided at a central portion of the lid 14.

Additionally, as a means of restraining a heat radiation from the furnace opening 3, a thermo plug 18 comprising a plane heating element, a heat shield panel, and the like is provided at the central portion of the lid 14 so as not to interfere with the prop 16.

Furthermore, a loading area 19, in which the boat 15 is conveyed out of the processing container 2 when the lid 14 is moved down and the wafers w are transferred between the boat 15 and a carrier (a cassette) as a carrying container, is provided at the lower portion of the processing container 2.

Additionally, an auxiliary heater 20 for heating the gas-discharging part 6 is provided at the upper portion of the main heater 7. In order to cool down the gas-discharging part 6 as rapidly as the processing container 2, a moving mechanism 21 for evacuating the auxiliary heater 20 (keeping the auxiliary heater 20 away) from the gas-discharging part 6 during a rapid cooling process of the main heater 7, is provided at the auxiliary heater 20.

In addition, a forcibly gas-discharging mechanism 22 is provided for forcibly discharging an atmospheric gas in a vicinity of the gas-discharging part 6. As shown in FIG. 8, the forcibly gas-discharging mechanism 22 is arranged so as to cover the gas-discharging part 6 when the auxiliary heater 20 is evacuated, and is mainly composed of: a heat-shielding cover 23 that communicates with an inside of the evacuated auxiliary heater 20, and a gas-discharging pipe 24 connected to the heat-shielding cover 23 for forcibly discharging a gas in the heat-shielding cover 23. Accordingly, an atmospheric gas in a vicinity of the gas-discharging part 6 in the heat-shielding cover 23 and an atmospheric gas in the auxiliary heater 20 can be forcibly discharged. Consequently, the gas-discharging part 6 can be efficiently cooled down.

The gas-discharging pipe 24 can be connected to an upstream part than the heat exchanging unit 13 of the gas-discharging duct 12. Additionally, it is preferable that the heat-shielding cover 23 is made of a metal (for example, made of SUS) and is provided with a cooling-water circulating channel 25 on a surface thereof so as to have a water-cooling structure.

As shown in FIG. 8, an insulating block 26 for insulating a circumference of a vertical rising portion of the gas-discharging part 6 is arranged on the top panel 8. A placing panel 27 made of a metal (for example, made of SUS) for placing the auxiliary heater 20 in such a manner that the auxiliary heater 20 is capable of moving in a horizontal direction, is provided on an upper surface of the insulating block 26.

As shown in FIG. 7, the auxiliary heater 20 is mainly composed of: an insulating material 28 having a shape that can cover the gas-discharging part 6 slidably from the rear part thereof (a right side in FIG. 7), that is, having a substantial cube shape whose under side and front side (a left side in FIG. 7) are opened, and a resistant heating wire 29 arranged (buried) in an inside of the insulating material 28. The auxiliary heater 20 is provided with a temperature sensor (a thermocouple) 30. It is preferable that a water-cooling jacket 32 having the cooling-water circulating channel 31 is provided on an outer surface of the auxiliary heater 20.

The insulating member 28 and the insulating block 26 are made of a molded product respectively. In addition, surfaces of these members are covered with an alumina cloth in order to prevent these members from generating a powder.

As shown in FIGS. 4A, 4B and 5, the moving mechanism 21 is mainly composed of: a right-and-left pair of front guiderails 33 and a right-and-left pair of rear guiderails 34 that extend in a horizontal moving direction to guide the auxiliary heater 20 so as to allow a horizontal movement thereof, guide rollers 37, 38 arranged at substantial four corners of the auxiliary heater 20 via arm portions 35,36 to be guided along the guiderails 33, 34, and an air cylinder 39 (refer to FIG. 1) that slides and moves the auxiliary heater 20. In order to avoid interference with the heat-shielding cover 23, the front guiderails 33 are arranged lower than the placing surface of the auxiliary heater 20, for example, on the top panel 8, so as not to interfere with the insulating block 26. On the other hand, the rear guiderails 34 are arranged at substantially the same height as the auxiliary heater 20 via a prop 40 (refer to FIG. 4B) fixed at a rear part of the first duct 12a. For example, as shown in FIG. 6, each of the guiderails 33, 34 has such a structure that a guiding groove 42 for guiding a guide roller is provided at one side of a panel member 41 made of a metal.

In order to reinforce a supporting structure of the rear guiderails 34 by making use of the heat exchanging unit 13 fixed on the housing, horizontal supporting members 44 are screwed on the heat exchanging unit 13 via a horizontal fixing bar 43 (refer to FIGS. 4A and 4B). The fixing bar 43 is screwed on the heat exchanging unit 13 by making use of existing screw holes (taps) provided on the heat exchanging unit 13. Additionally, a fixing member 45 for the air cylinder 39 is fixed on an upper portion of the heat exchanging unit 13 via the fixing bar 43. An anchor end portion of the air cylinder 39 is fixed to the fixing member 45 via a bracket 46. On the other hand, a tip portion of a piston rod 39a of the air cylinder 39 is connected to a rear portion of the auxiliary heater 20 via a bracket 47.

During heating, the auxiliary heater 20 is located at a position where it covers the gas-discharging part 6. To be concrete, as shown in FIG. 7, the auxiliary heater 20 is located at a position where it is placed on (above) the insulating block 26 and is contained inside the heat-shielding cover 23.

On the other hand, while being evacuated, the auxiliary heater 20 is moved away from the gas-discharging part 6. To be concrete, as shown in FIG. 8, a tip part of the auxiliary heater 20 is located at an opening end of the heat-shielding cover 23, so that an inside of the heat-shielding cover 23 and an inside of the auxiliary heater 20 communicate with each other.

The heat-shielding cover 23 is formed in a gate-shape or in an upside-down U-shape in its cross-section, and both leg portions thereof are fixed on the panel member 41 of the right-and-left pair of the front guiderails 33. A front part of the heat-shielding cover 23 is covered with a front cover part 23a except for a part through which the gas-discharging part 6 passes. On the other hand, a rear part of the heat-shielding cover 23 is opened so as to allow the auxiliary heater 20 to move for evacuation.

The auxiliary heater 20 is slided and moved by only a predetermined length L (for example, L=about 185 mm) from a heating position to an evacuated position by means of the air cylinder 39. In order to reduce frictional resistance during the sliding movement and to prevent dust such as a metal powder from generating, it is preferable that the auxiliary heater 20 floats up from the placing surface of the placing panel by only a predetermined dimension d (for example, d=about 15 mm)

immediately after the auxiliary heater 20 starts to move from the placing position (the heating position) on (above) the insulating block 26. For this purpose, inclined portions 33a, 34b are provided at front end sides of the respective guiderails 33, 34 (refer to FIG. 4B).

Incidentally, a pipe that connects the cooling-water circulating channel 31 of the water cooling jacket 32 of the auxiliary heater 20 (refer to FIG. 1) and a circulating and supplying unit for the cooling water (not shown) is composed of a flexible pipe.

Additionally, at a lower portion of the auxiliary heater 20 located at the evacuated position, a heat-shielding plate 48 for restraining a heat radiation out of the lower part of the auxiliary heater 20 is arranged so as to cover an exposed part of an under surface of the auxiliary heater 20 (refer to FIG. 8). Preferably, the heat-shielding plate 48 is water-cooling type. For example, it is provided with a water-cooling circulating channel 49. Incidentally, in this embodiment, the heat-shielding 48 is fixed on an upper portion of the first duct 12a.

According to the vertical thermal processing apparatus 1 composed as described above, the gas-discharging part 6 can be cooled down as rapidly as the processing container 2 during a temperature-lowering process or during a maintenance process such as a dry cleaning. Consequently, a waiting time during operation of the apparatus or a downtime during maintenance thereof is shortened, and thus it is possible to improve throughput thereof and to improve productivity thereof. Additionally, as the gas-discharging part 6 can be cooled down as rapidly as the processing container 2, the film remaining phenomenon on the inner surface of the gas-discharging part 6 can be solved, and thus the problem of generation of particles caused by the remaining film can be solved.

Since the forcibly gas-discharging mechanism 22 is composed of: the heat-shielding cover 23 that covers the gas-discharging part 6 (covers a circumference of the gas-discharging part 6) when the auxiliary heater 20 is evacuated and that communicates with the inside of the evacuated auxiliary heater 20, and the gas-discharging pipe 24 that is connected to the heat-shielding cover 23 so as to forcibly discharge a gas in the heat-shielding cover 23, it is possible to effectively cool down the gas-discharging part 6 and also to prevent a heat influence due to a heat radiation out of the gas-discharging part 6.

Furthermore, since the heat-shielding cover 23 has the water-cooling structure, it is possible to cool down the gas-discharging part 6 more effectively.

Moreover, since the gas-discharging duct 12 for forcibly discharging a gas in the main heater 7 is connected to the main heater 7 and the gas-discharging pipe 24 of the forcibly gas-discharging mechanism 22 of the auxiliary heater 20 is connected to the gas-discharging duct 12, a gas-discharging power by the gas-discharging duct 12 of the main heater 7 can be applied as a forcibly gas-discharging power of the forcibly gas-discharging mechanism 22 of the auxiliary heater 20 so that the structure thereof is simplified and the cost thereof is reduced.

Besides, according to this embodiment, the inner surface of the processing container 2 and the inner surface of the gas-discharging part 6 can be dry-cleaned rapidly and evenly by cooling down the processing container 2 and the gas-discharging part 6 rapidly. Accordingly, generation of particles caused by the film remaining plenomenon can be prevented, and the throughput thereof can also be improved.

Incidentally, supply of an electric power to the main heater 7 is stopped while the main heater 7 is rapidly cooled down.

In addition, supply of an electric power to the auxiliary heater 20 is stopped while the auxiliary heater 20 is evacuated (including a time while being forcibly gas-discharged).

According to the vertical thermal processing apparatus 1 of this embodiment, it is possible to shorten a time to lower the temperature of the gas-discharging part 6 from 800° C. to 100° C., to about 65 minutes, while it has taken about 110 minutes in the past.

Hereinbefore, although the embodiments of the present invention has been described in details in the drawings, it is understood that the present invention is not intended to be limited to the above-described embodiments, and various changes of the designs and the like may be made therein without departing from the sprit of the present invention. Additionally, the present invention can be applied to the existing vertical thermal processing apparatuses without a major remodeling.

Furthermore, each step that is conducted in the above-described vertical thermal processing apparatus can be controlled by a computer system 80. A program that is executed in the computer system 80 for the control, and a storage medium capable of being read by a computer and storing the program are in the scope of the protection of the present application.

The invention claimed is:

1. A vertical thermal processing apparatus comprising:
    a processing container that contains an object to be processed,
    a main heater provided so as to surround the processing container for heating the processing container, the main heater also having a rapid cooling function,
    a gas-discharging part formed at an upper portion of the processing container, the gas-discharging part being bent,
    an auxiliary heater configured to have an open interior whereby the auxiliary heater covers over the gas-discharging part with the gas-discharging part received within the heater's interior in order to heat the gas-discharging part,
    a moving mechanism for moving the auxiliary heater away from the gas-discharging part during a rapid cooling process of the main heater, while the main heater remains surrounding the processing container, and
    a forcibly gas-discharging mechanism for forcibly discharging an atmospheric gas in a vicinity of the gas-discharging part, wherein
    the forcibly gas-discharging mechanism has:
    a heat-shielding cover that has an interior that receives the gas-discharging part to cover the gas-discharging part, the heat-shielding cover's interior communicating with the auxiliary heater's interior when the auxiliary heater is moved away from the gas-discharging part, and
    a gas-discharging pipe connected to the heat-shielding cover, for forcibly discharging a gas in the heat-shielding cover.

2. A vertical thermal processing apparatus according to claim 1, wherein
    the heat-shielding cover has a water-cooling structure.

3. A vertical thermal processing apparatus according to claim 1 or 2, wherein
    the main heater is connected to a gas-discharging duct for forcibly discharging a gas in the main heater, and
    the gas-discharging duct is connected to the gas-discharging pipe of the forcibly gas-discharging mechanism.

* * * * *